United States Patent [19]

Hikin

[11] 4,255,757
[45] Mar. 10, 1981

[54] HIGH REVERSE VOLTAGE SEMICONDUCTOR DEVICE WITH FAST RECOVERY TIME WITH CENTRAL DEPRESSION

[75] Inventor: Boris L. Hikin, Playa del Rey, Calif.

[73] Assignee: International Rectifier Corporation, Los Angeles, Calif.

[21] Appl. No.: 966,644

[22] Filed: Dec. 5, 1978

[51] Int. Cl.³ .................... H01L 29/12; H01L 29/90; H01L 29/34
[52] U.S. Cl. ...................... 357/58; 357/52; 357/55; 357/13
[58] Field of Search .................. 357/58, 55, 13, 52

[56] References Cited

U.S. PATENT DOCUMENTS

| 3,449,826 | 6/1969 | Eugster | 357/55 |
|---|---|---|---|
| 3,489,958 | 1/1970 | Gramberg et al. | 357/55 |
| 3,506,892 | 4/1970 | Adam | 357/58 |
| 3,519,506 | 7/1970 | Topas | 357/55 |
| 3,575,644 | 4/1971 | Huth | 357/55 |
| 3,656,228 | 4/1972 | Glass | 357/55 |
| 4,047,196 | 9/1977 | White et al. | 357/55 |
| 4,092,663 | 5/1978 | Schafer | 357/55 |

FOREIGN PATENT DOCUMENTS 2284989  4/1976  France ..................... 357/58

Primary Examiner—Andrew J. James
Attorney, Agent, or Firm—Ostrolenk, Faber, Gerb, & Soffen

[57] ABSTRACT

A high voltage, fast recovery time P-I-N diode is described in which the wafer used to form the device has a central depression. The central depression causes avalanche breakdown to occur preferably at the center of the device and through the bulk of the device rather than at the device edge which could irreversibly damage the device. The central depression also distorts the electric field lines as they terminate on the device edge so that they are more linearly distributed along the edge, thereby increasing the ability of the device to withstand breakdown at the edge of the device.

14 Claims, 14 Drawing Figures

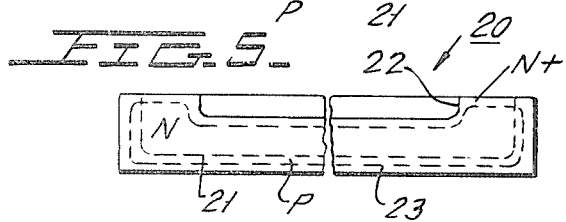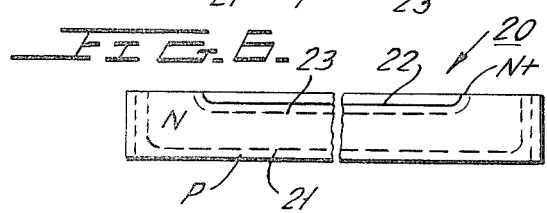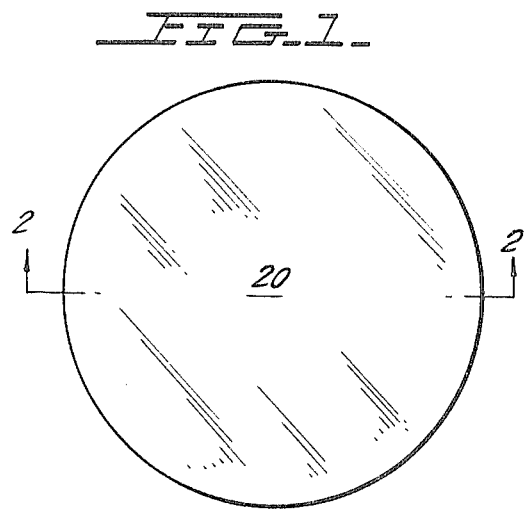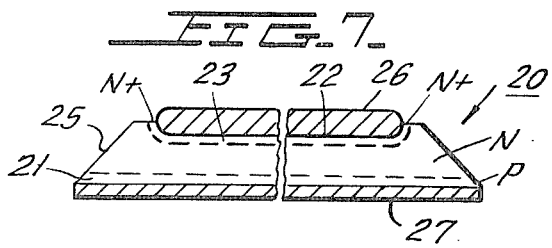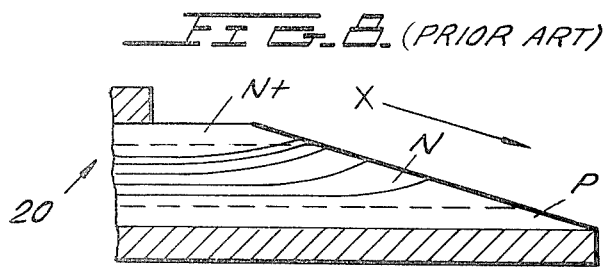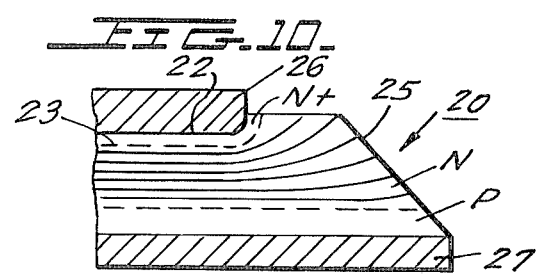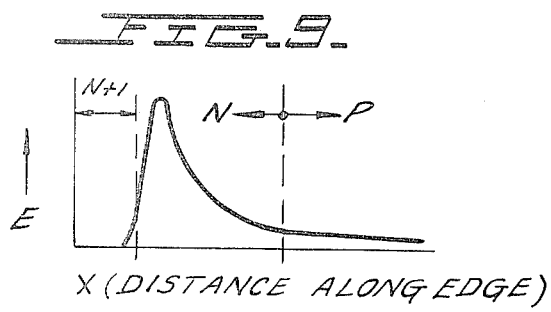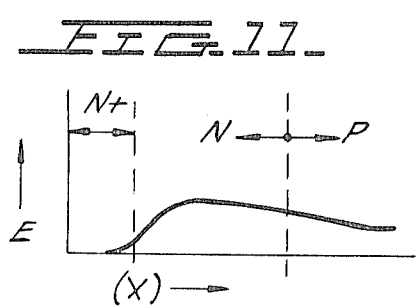

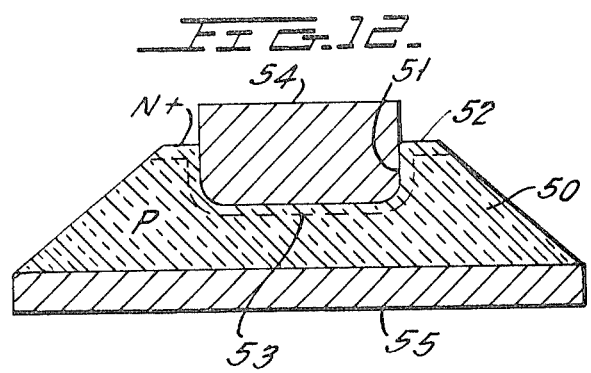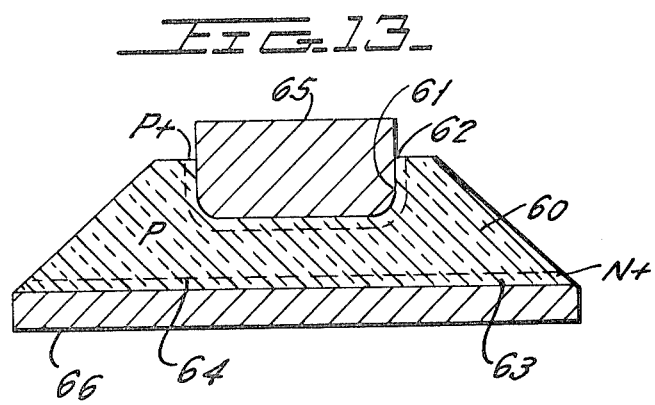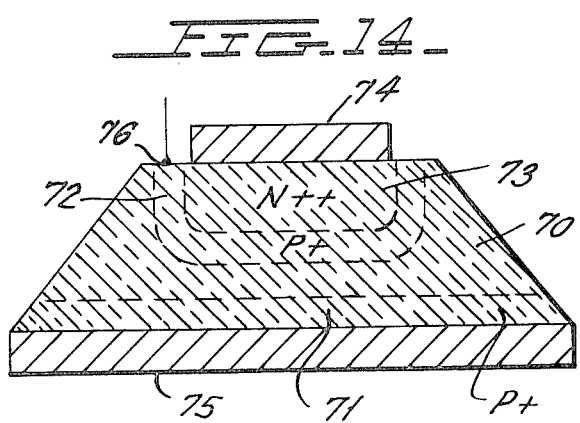

HIGH REVERSE VOLTAGE SEMICONDUCTOR DEVICE WITH FAST RECOVERY TIME WITH CENTRAL DEPRESSION

BACKGROUND OF THE INVENTION

This invention relates to semiconductor devices, and more specifically relates to a novel structure for increasing the ability of the device to withstand reverse voltage.

It is well known that a semiconductor device can break down through the bulk of its body without being damaged but that breakdown across the edge of the device will cause excessive localized heating which will damage the device. Consequently, the use of guard rings is known which, in effect, reduce the thickness of the semiconductor at its center to encourage the device to break down within its bulk at a lower voltage than would cause breakdown at its edge. Wafer edge geometries, particularly tapers of various shapes, have been used to improve the field distribution across the wafer edge and to increase the reverse voltage which can be withstood across the wafer edge. Examples of prior U.S. patents using guard rings and particular edge geometries are Nos. 3,922,709, 3,984,859, 4,040,084, and 4,047,196.

The problem of providing a suitable edge taper is aggravated for the case of P-I-N type devices where the taper direction desired for the P-N junction is wrong for the N, N+ junction (or, P, P+ junction). Thus wedge-shaped configurations have been suggested for the edge of the device. However, the manufacture of a wedge-shaped cut-out in the edge of a very thin wafer is difficult and the structure is not commercially feasible.

The use of a P-I-N structure is very desirable for high voltage devices since the P-I-N structure permits the use of a thinner wafer than a conventional P-N structure and reduces the forward voltage drop of the device and increases its recovery speed. However, when a thinner wafer is used, the field gradient across the edge of the wafer is increased and the devices require very sharp tapers, frequently less than six degrees. This sharp taper is very hard to make since the sharp wafer edge tends to chip or crack and the device becomes very fragile. Moreover, the current carrying area of the device is greatly reduced.

BRIEF DESCRIPTION OF THE PRESENT INVENTION

The principle of the present invention is to form a shallow well in the center of the wafer and to diffuse a high conductivity region into the surface regions of the well of the same conductivity type as the body of the wafer. Thus, if the body of the wafer is N type, an N+ region is formed in the surface of the well. The well first forms a reduced thickness region which will go into avalanche bulk breakdown before the edge of the device will break down. Moreover, the shape of the N, N+ junction formed in the well will distort the depletion region formed during reverse-bias conditions in such a manner that the electric field gradient across the wafer is reduced in the regions near the N+ region. This then improves the reverse voltage behavior of the device without need for a very sharp taper angle on the edge of the wafer.

BRIEF DESCRIPTION OF THE DRAWINGS

FIG. 1 is a plan view of the initial wafer used for the device of the invention.

FIG. 2 is a cross-sectional view of FIG. 1 taken across section line 1—1 in FIG. 1.

FIG. 3 shows the wafer of FIG. 1 after an initial diffusion operation.

FIG. 4 shows the wafer of FIG. 3 after lapping off the upper P type region.

FIG. 5 shows the wafer of FIG. 4 after forming a well in the center thereof and after diffusing an N+ region into the surface of the wafer.

FIG. 6 shows the wafer of FIG. 5 after etching off the N+ surface regions on the wafer bottom and on the rim of the upper wafer surface.

FIG. 7 shows the wafer of FIG. 6 after contacts are applied thereto and after a relatively large angle bevel is applied to the wafer.

FIG. 8 schematically illustrates the edge of a prior art device with a sharp taper and shows the equipotential field lines in the device.

FIG. 9 shows the electric field distribution across the edge of the device of FIG. 8.

FIG. 10 schematically illustrates the edge of a device constructed in accordance with the invention and shows equipotential field lines in the device.

FIG. 11 shows the electric field distribution across the edge of the device of FIG. 10.

FIGS. 12 to 14 show the application of the invention to other type devices.

DETAILED DESCRIPTION OF THE DRAWINGS

The following describes a typical application of the present invention to a fast recovery P-I-N diode which may be rated at 2000 volts, 250 amperes, with a very low forward voltage drop. The dimensions and process steps which are given can be varied as desired to produce equivalent devices and devices with other ratings.

FIGS. 1 and 2 show the starting wafer 20 which is a monocrystalline silicon wafer having a diameter of about one inch, a thickness of about 20 mils and a resistivity of from 100 to 200 ohm centimeters.

After suitable cleaning, wafer 20 is placed in a diffusion furnace and a gallium diffusion process is carried out, to cause a P-type region 21 in the surface of wafer 20 to a depth of about 3 mils as shown in FIG. 3. The P-type region in the upper surface is then lapped off, as shown in FIG. 4 to reduce the wafer thickness to about 14 mils.

The wafer is then cleaned and masked and an opening 22 is formed by etching into the center of wafer 20 as shown in FIG. 5. The central opening or well 22 has a diameter of about ¾ inch and a depth of about 3 mils, and is coaxial with wafer 20. The mask is removed and the wafer is again cleaned and is placed in a diffusion chamber for a phosphorus diffusion to form an N+ layer 23 around the wafer with a depth of about 1½ mils as shown in FIG. 5. This diffusion may typically be at 1250° C. for from 10 to 15 hours.

The surface of opening 22 is then masked and wafer 20 is etched to remove the N+ layer on its bottom surface, and at least a portion of the N+ rim on the upper surface of the wafer. This etch takes off about 1½ mils from the top and bottom of the wafer, and leaves the N+ region in the surface of opening 22, as shown in FIG. 7. The mask is removed and the wafer is cleaned and a tapered bevel 25, which may have a large angle such as 45° is then formed around the rim of wafer 25, as shown in FIG. 7. Appropriate conductive electrodes 26 and 27 are applied to the upper N+ region 23 and lower P region 21, respectively as shown in FIG. 7.

The resulting device will now have low forward voltage drop and high recovery speed because of the thin intrinsic or N region of the device as compared to the thick region provided in the equivalent conventional P-N diode. Moreover, bulk avalanche breakdown will occur in the reduced thickness region beneath the well 22 rather than over the device edge even though relatively large taper angles (45°) are used. This is because the novel structure causes the equipotential lines to be more evenly distributed across the edge of the device as illustrated in FIGS. 8 to 11.

Referring to FIG. 8, there is shown a prior art tapered edge P-I-N device. The equipotential lines are shown in FIG. 8, and it is seen that, under reverse voltage conditions, the depletion regions formed causes the electric field to be concentrated at the junction between the N+ and N regions (see FIG. 9). Consequently, a high localized stress is produced which can cause local breakdown and destruction of the wafer at voltages lower than those which would cause bulk avalanche breakdown. This can be overcome only by using sharper taper angles for example, 6° and less, which lead to serious manufacturing problems and to reduction of available current-carrying area for the device.

FIGS. 10 and 11 show the manner in which the well 22 and the shape of N+ region 23 cause the equipotential lines to distribute more evenly over the edge of the wafer 20 during reverse voltage conditions. The reduction in the local peak of the voltage gradient at the N+ region, as shown in FIG. 11, permits the use of a very large and easily made taper for the wafer edge.

Note that the invention can also apply to a P-N diode requiring a negative bevel, a P+, P, N diode, and to multilayer devices such as controlled rectifiers as well as to the disclosed P-I-N diode.

FIG. 12 shows the invention as applied to a P-N diode consisting of a body 50 of P type silicon having a well 51 therein which has an N+ impurity region 52 which forms a P-N junction 53. The top and bottom of the silicon wafer receive suitable metallic contacts 54 and 55, respectively.

FIG. 13 shows the application of the invention to a P+, P, N+ diode wherein the P type silicon body 60 has a well 61 therein which has a P+ surface 62. The bottom of body 60 contains the N+ region 63 which forms the P-N+ junction 64. The top and bottom of the body 60 receive contacts 65 and 66, respectively.

FIG. 14 shows the application of the invention to a thyristor. In FIG. 14, an N type body 70 has a lower P+ region 71, an upper P+ base region 72 and an N++ emitter region 73. The device is further provided with cathode and anode electrodes 74 and 75, respectively, and a gate electrode 76. The deep region 72 serves as the well of the preceding figures and, under forward bias, the device has a breakdown voltage which is higher than if the junction between regions 70 and 72 was flat.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A high voltage semiconductor device which at least includes a P-I-N diode comprising a monocrystalline wafer of semiconductor material having first and second spaced, generally parallel surfaces; said wafer having a first region of one of the conductivity types extending from said first surface; a second and central region ajoining one side of said first region and being of the other of the conductivity types and having a relatively high resistivity; and a third region of said other of the conductivity types which adjoins the opposite side of said central region and extends to said second surface; said third region having a central depression therein; said third region generally following the contour of said central depression and terminating on said second surface; said first, second and third regions having a common peripheral edge, whereby electric field equipotential lines during reverse biasing of said P-I-N diode are relatively widely distributed around said edge of said wafer to decrease the local field stress on said edge of said device.

2. The device of claim 1 wherein the rim of said wafer is tapered in a direction to reduce the area at the top of said third region of said wafer relative to the bottom of said first region.

3. The device of claim 2 wherein said taper has an angle substantially greater than 6° relative to the plane of said wafer and wherein said device has a reverse voltage withstand ability in excess of 1500 volts.

4. The device of claim 1, 2 or 3 which further includes first and second contact means connected to said first and third regions respectively.

5. The device of claim 4 wherein said first region is of P type and wherein said central region and upper regions are of the N and N+ types respectively.

6. The device of claim 1, 2 or 3 wherein said central region has a thickness beneath said central depression of less than about 10 mils.

7. The device of claim 3 wherein said taper has an angle of about 45°.

8. A high voltage P-I-N diode comprising a monocrystalline wafer of semiconductor material having generally parallel first and second end surfaces; said first end surface having a central depression therein; a first relatively high conductivity region in said wafer of one of the conductivity types extending from the surface of said central depression; a second relatively low conductivity region of said one of said conductivity types adjoining said first region and extending for a predetermined distance away from said first region and extending to the outer edge of said wafer; and a third conductivity region of the other of said conductivity types extending from said second end surface and adjoining said second conductivity region; said first and second regions meeting one another on said first end surface; said second and third regions meeting one another on the peripheral edge of said wafer, whereby electric field equipotential lines during reverse biasing of said P-I-N diode are relatively widely distributed around said peripheral edge of said wafer to decrease the local field stress on said edge of said wafer.

9. The diode of claim 8 wherein said peripheral edge of said wafer is tapered in a direction to reduce the area of said first end surface relative to said second end surface.

10. The diode of claim 9 wherein said taper has an angle substantially greater than 6° relative to the plane of said wafer and wherein said diode has a reverse voltage withstand ability in excess of 1500 volts.

11. The diode of claim 8 wherein said first region is of the N+ type, said second region is of the N type, and said third region is of the P type.

12. The diode of claim 9 wherein the central region beneath said central depression has a thickness of less than about 10 mils.

13. The diode of claim 9 wherein said taper has an angle of about 45°.

14. The device of claim 4 wherein said central region has a thickness beneath said central depression of less than about 10 mils.

* * * * *